(12) United States Patent
Johnson

(10) Patent No.: US 6,281,530 B1
(45) Date of Patent: Aug. 28, 2001

(54) LPNP UTILIZING BASE BALLAST RESISTOR

(75) Inventor: F. Scott Johnson, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/371,647

(22) Filed: Aug. 10, 1999

Related U.S. Application Data

(60) Provisional application No. 60/107,198, filed on Nov. 5, 1998.

(51) Int. Cl.$^7$ .................. H01L 31/0336; H01L 31/119; H01L 29/00; H01L 27/082; H01L 31/0288
(52) U.S. Cl. .................. 257/223; 257/197; 257/378; 257/557; 257/558; 257/563; 257/564; 257/565; 257/592; 257/610; 257/567; 257/273; 257/345; 257/362
(58) Field of Search .................. 257/423, 197, 257/378, 557, 558, 563, 564, 565, 592, 610, 567, 273, 345, 362

(56) References Cited

U.S. PATENT DOCUMENTS 5,945,726 * 8/1999 Prall et al. .................. 257/565
6,004,840 * 12/1999 Kimura et al. .................. 438/234
6,063,672 * 5/2000 Miller et al. .................. 438/275

FOREIGN PATENT DOCUMENTS

5705162 * 3/1982 (JP) .
2000150527 * 5/2000 (JP) .

* cited by examiner

Primary Examiner—Stephen D. Meier
Assistant Examiner—James Mitchell
(74) Attorney, Agent, or Firm—Jacqueline J. Garner; W. James Brady, III; Frederick J. Telecky, Jr.

(57) ABSTRACT

A lateral PNP transistor (LPNP) (102) having the low resistance base buried N+ region (114) removed from below the emitter region (118). This leaves a high resistance n-well (116) below the emitter. The resistance from the center of the emitter region (118) to the N+ buried region (114) is greater than the resistance at the periphery of the emitter region (118) to the N+ buried region (114). Debiasing will occur in the center of the emitter region (118) where the parasitic base current is generated. Thus, the ratio of parasitic current to active collector current and peak beta will improve.

7 Claims, 3 Drawing Sheets

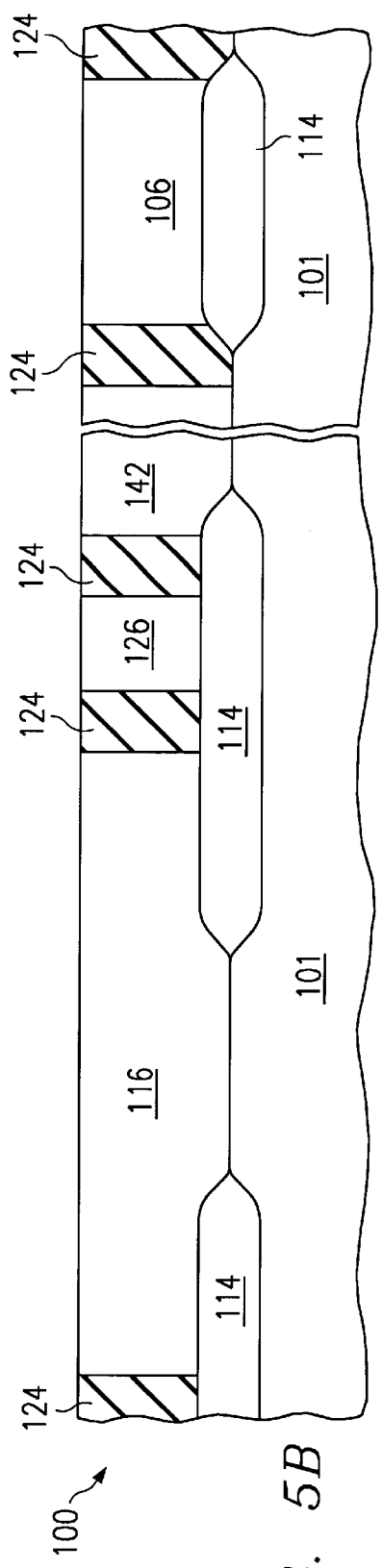
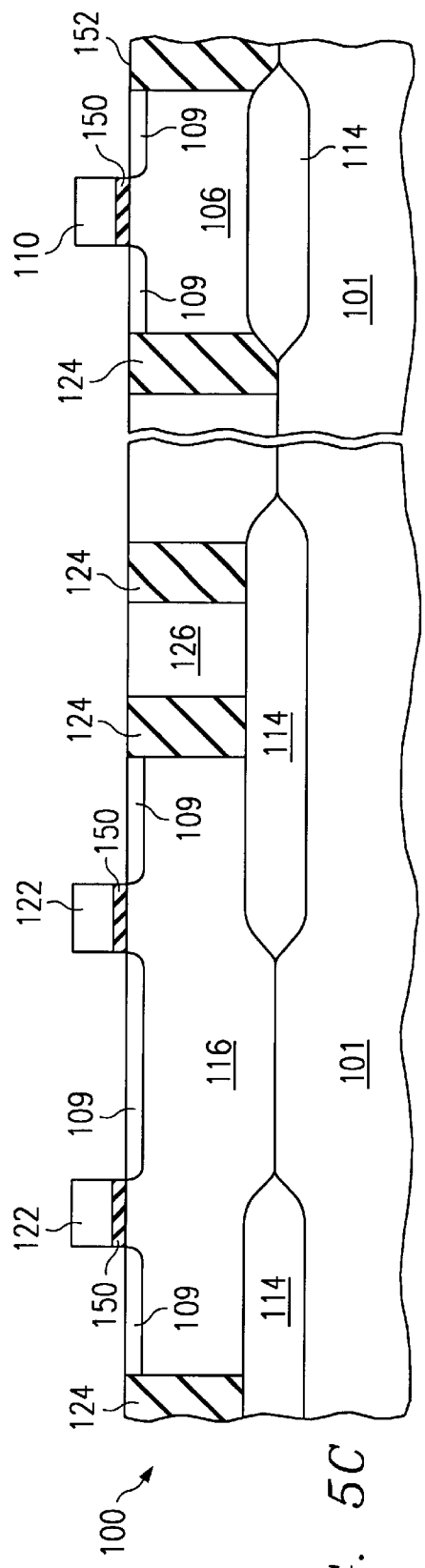

LPNP UTILIZING BASE BALLAST RESISTOR

This application claims priority under 35 USC §119(e)(1) of provisional application No. 60/107,198 filed Nov. 5, 1998.

FIELD OF THE INVENTION

The invention is generally related to the field of forming bipolar transistors and more specifically to a method of forming a lateral bipolar transistor using a BiCMOS process.

BACKGROUND OF THE INVENTION

Lateral PNP bipolar transistors (LPNPs) are desired for many mixed signal integrated circuit (IC) designs. Mixed signal ICs combine both digital and analog circuitry and thus typically comprise CMOS transistors as well as NPN bipolar transistors, high performance capacitors, LPNPs and sometimes resistors. LPNPs may be used in applications such as current mirrors, active loads, and complementary bipolar logic. An example of a critical circuit application for a LPNP is the filter null circuit where the LPNP current mirror has been shown to out-perform the best design using a PMOS based current mirror. The LPNP has higher dynamic range, higher transconductance, lower parasitic capacitance, low operating voltage, higher bandwidth (3X PMOS), less gain variation due to output voltage, and lower DC offset voltage. As a result, LPNPs are very desirable for hard disk drive (HDD) applications.

A typical LPNP design for a mixed signal IC is shown in FIG. 1. Because the LPNP is formed using a BiCMOS process, the formation of the LPNP is designed to use as many of the steps for forming the CMOS transistors as possible. A N+ buried layer 14 is formed in a substrate 12 and functions as the low resistance base of the LPNP 10. N-well 16 is the base of the LPNP 10. The emitter 18 and collector 20 are formed in N-well 16 using a standard p+ source/drain (S/D) implant. The polysilicon (poly) gate electrode 22 is tied to the emitter region 18. LPNP 10 is essentially an inherent PNP of a PMOS transistor optimized for PNP performance. Isolation regions 24 isolate LPNP 10 from other devices (not shown) and from the base contact 26.

There are two dominant currents in LPNP 10. The first is the base or parasitic current. The base current is the electrons and holes injected vertically between the n-well 16 and emitter 18 junction area. The second dominant current is the collector or active current. The collector current is the holes diffused laterally through the "channel" region 28 of the base n-well 16 between the emitter 18 and collector 20.

LPNPs achieve gain from the active current. However, the gain is reduced by the parasitic current. The gain (beta) of the LPNP is proportional to the ratio of the periphery to the area of the emitter S/D diffusion or the ratio of the active to parasitic base-emitter junction. As a result, Beta is proportional to 1/(length of the polysilicon gate):1/(base width). Accordingly, the gain (beta) can be increased by decreasing the poly gate length. However, since the collector and emitter profiles are constant (i.e., fixed by the CMOS design parameters), the early voltage is proportional to the length of the polysilicon gate 22. (The early voltage is proportional to the sum of the active base doping.) Thus, increasing the gate length improves the early voltage. As a result, the beta*early voltage product, a measure of the performance of the LPNP, is relatively constant for a given CMOS technology regardless of base width.

The LPNP typically uses a layout having a circular collector to improve the periphery to area ratio of the emitter. FIG. 2 shows a cross-section of a circular collector LPNP 10 and FIG. 3 is a top view of the same device. A gate length of 0.6 microns results in a beta (gain) of 16 and an early voltage of 12, for a total product of 192. If the gate length is increased to 0.8 microns, the beta is 9 and the early voltage is 20 for a product of 180. The different is relatively insubstantial. For HDD applications, both a beta and early voltage of 20 is desired. Accordingly, improvements in the gain and/or early voltage are needed without substantial increases in process cost.

SUMMARY OF THE INVENTION

A method of forming a LPNP transistor having a base ballast resistor is disclosed herein. The low resistance base region is a buried n+ region located under the collector region but not substantially under the emitter region.

An advantage of the invention is providing a LPNP having improved gain.

This and other advantages will be apparent to those of ordinary skill in the art having reference to the specification in conjunction with the drawings.

BRIEF DESCRIPTION OF THE DRAWINGS

In the drawings:

FIGS. 5A–5C are cross-sectional diagrams of the LPNP transistor of FIG. 4 at various stages of fabrication.

DETAILED DESCRIPTION OF THE EMBODIMENTS

The invention is a lateral bipolar transistor design. It is described in conjunction with a BiCMOS device and method having both a lateral PNP (LPNP) and CMOS transistors. It will be apparent to those of ordinary skill in the art that the benefits of the invention may be applied to other processes and devices for which lateral bipolar transistor are desired, especially those devices requiring both CMOS and bipolar transistors.

Figure 1:
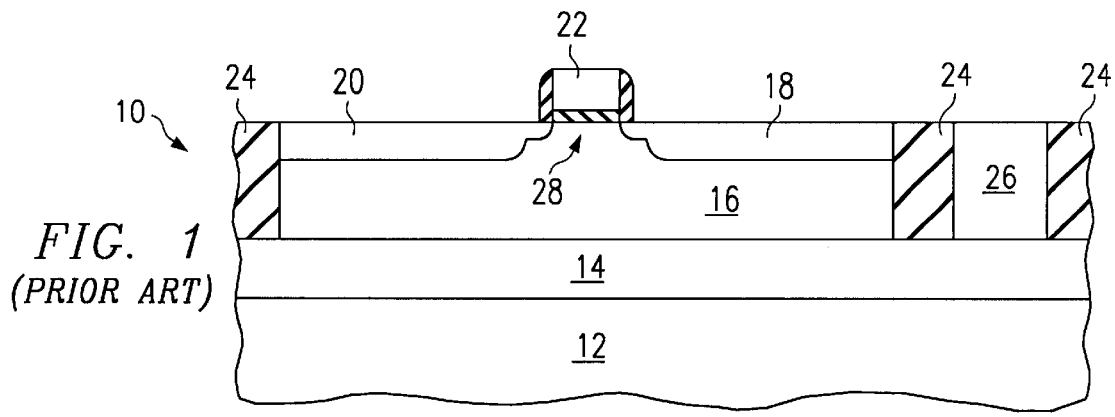
FIG. 1 is a cross-sectional diagram of a prior art LPNP transistor design.
Figure 2:
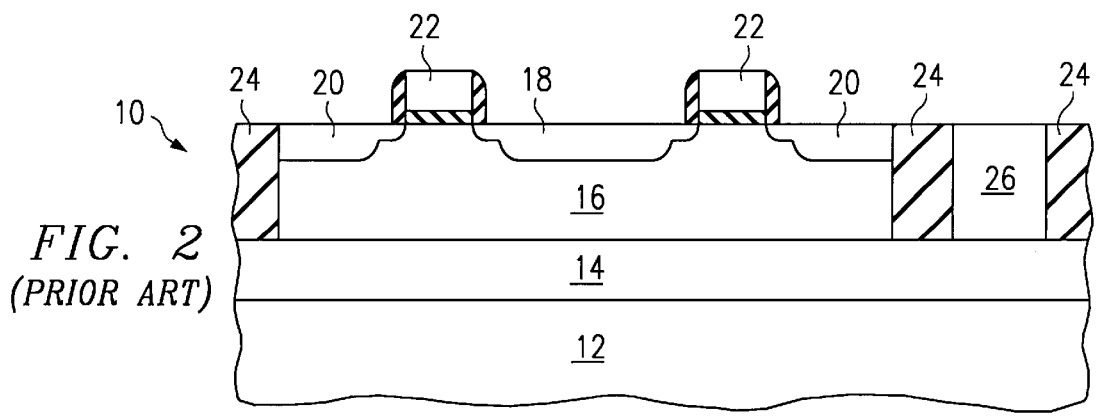
FIG. 2 is a cross-sectional diagram of a layout for a prior art LPNP transistor.
Figure 3:
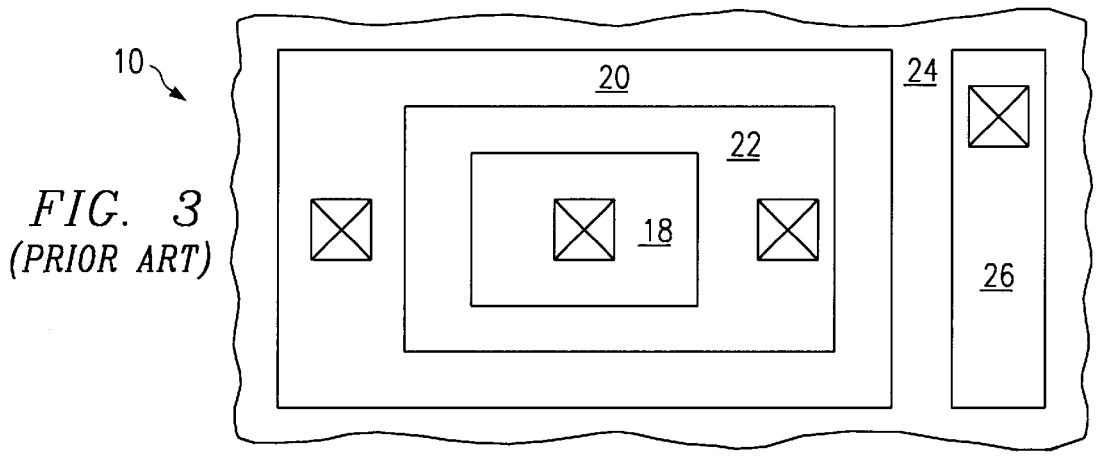
FIG. 3 is a top view of a layout for a prior art LPNP transistor.
Figure 4:
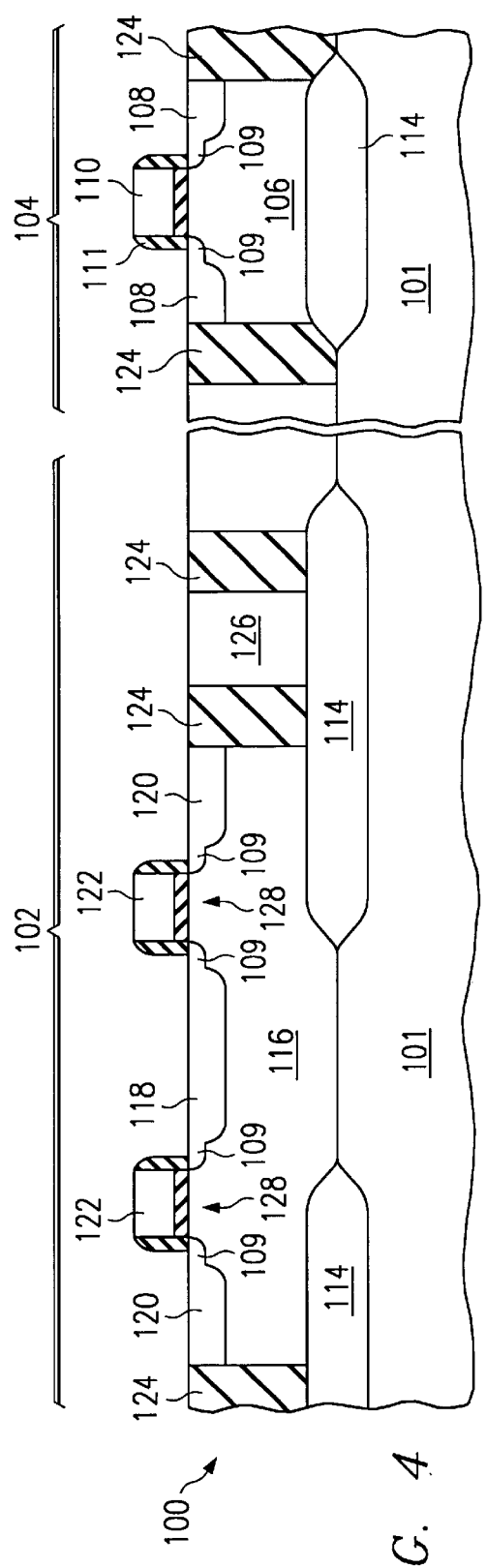
FIG. 4 is a cross-sectional diagram of a LPNP transistor according to the invention.

A BiCMOS device 100 having a LPNP 102 and a CMOS transistor 104 is shown in FIG. 4. CMOS transistor 104 is a standard p-type MOS transistor. It is formed in a n-well region 106 and includes p-type source/drain regions 108 and a gate electrode 110. Gate electrode 110 typically comprises polysilicon. Source/drain regions 108 may include drain extension regions 109 extending under sidewall spacers 111.

Because the LPNP 102 is formed using a BiCMOS process, the formation of the LPNP 102 is designed to use as many of the steps for forming the CMOS transistor 104 as possible in order to reduce cost. N-well 116 is similar to n-well 106 and forms the base of the LPNP 102. The emitter 118 and collector 120 are formed in n-well 116 and are similar to source/drain regions 108 (including any drain extensions 109). The gate electrode 122 is typically identical to the CMOS gate electrode 110 including sidewall spacers 111. The gate electrode 122 is tied to the emitter region 118.

LPNP 102 is essentially an inherent PNP of a PMOS transistor connected for PNP operation. Isolation regions 124 isolate LPNP 102 and CMOS transistor 104 from each other and from other devices (not shown). An isolation region 124 is also used to separate n-well 116 from the base contact 126.

A n+ buried layer 114 is formed in a substrate 101 below n-well 116. N+ buried layer 114 functions as the low resistance base of the LPNP 102 and provides a low resistance path from the base (n-well 116) under an isolation region 124 to the base contact 126. However, in contrast to prior art structures, n+ buried layer 114 does not extend under the center of the emitter region 118. N+ buried layer 114 does extend under the collector region 120 and, preferably, at least a portion of the gate electrode 122. N+ buried layer 114 may even extend under the edge of emitter region 118. The purpose of not extending n+ buried region 114 under the center of the emitter region 118 is to reduce the parasitic current of the LPNP 102 and increase the gain.

In the preferred embodiment, the edge of the n+ buried region 114 is approximately aligned with the edge of the gate electrode 122. It is preferred to have the n+ buried region as close to the emitter edge as possible. However, the edge of the n+ buried layer may diffuse further under the emitter region 118, as this diffused edge will be more lightly doped. The edge of the n+ buried layer 114 may vary a distance +/− the thickness of the n-well 116 from a point aligned with the edge of the gate while still obtaining beneficial results.

There are two dominant currents in LPNP 102. The first is the base or parasitic current. The base current is the electrons and holes injected vertically between the n-well 116 and emitter 118 junction area along the length of the emitter region 118. The second dominant current is the collector or active current. The collector current is the holes diffused laterally through the "channel" region 128 of the base n-well 116 between the emitter 118 and collector 120.

The invention increases the parasitic base resistance relative to the active area resistance. Because there is no low resistance base region (N+ buried region 114) below the center portion of the emitter region, the resistance from the center of the emitter-base junction to the edge of the low resistance base region 114 is increased. However, the resistance at the periphery is not significantly increased because the n+ buried layer 114 extends much closer to the periphery of the emitter region. The higher resistance at the center of the emitter causes a voltage drop and lower parasitic base current. Because debiasing will occur at the center of the emitter where the parasitic base current is generated, the ratio of the parasitic base current to lateral base current and peak Beta will improve.

The early voltage is the sum of the active doping in the channel region 128. As such, the early voltage is proportional to the length of the gate electrode. Because the length of the gate electrode is not adjusted to improve gain, the early voltage is not affected. In contrast to the prior art, the Beta*early voltage product can be improved.

A method for forming BiCMOS device 100 according to the invention will now be discussed with reference to FIGS. 5A–5C and FIG. 4. The invention may use a conventional BiCMOS process flow with a simple mask change to prevent the n+ buried layer 114 from be formed below the subsequently formed emitter region 118. As such, the invention can easily be incorporated into a variety of BiCMOS process flows. An exemplary flow win now be described.

Figure 5A:
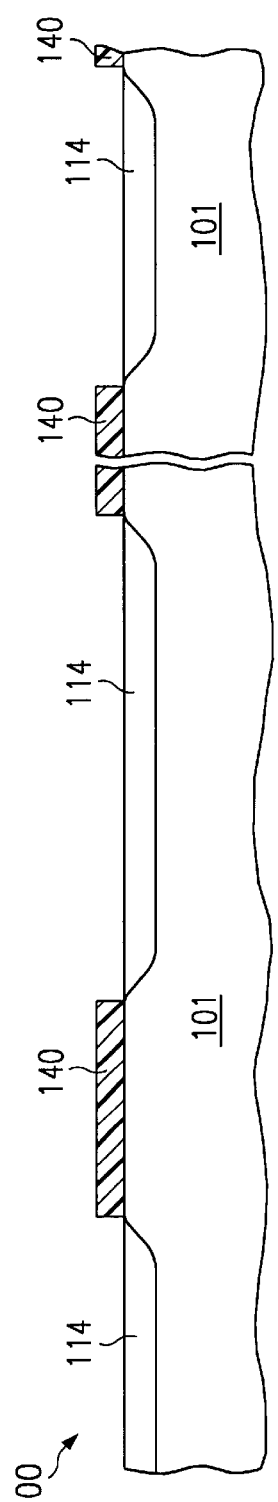

Referring to FIG. 5A, a n+ buried layer 114 is selectively formed in substrate 101. The surface of substrate 101 is oxidized. A first mask is then used to remove the oxide 140 at the surface where buried n-type layers are desired. N+ buried layer 114 may then be formed by implantation of a n-type dopant such as arsenic or antimony. The dopant may be implanted at ~30 keV and ~$10^{15}$ atoms/$cm^2$ and then annealed to diffuse and active the dopant. Prior art designs placed the n+ buried layer under the entire area for LPNP 102. In contrast, n+ buried layer 114 is not placed in the center of the area for LPNP 102 where the emitter will be formed. N+ buried layer 114 may also be used for any NPN collectors (not shown) or under PMOS-wells, such as well 106, for reducing latch-up. Oxide layer 140 is then removed.

Referring to FIG. 5B, an intrinsic epitaxial layer 142 is then formed over the substrate 101 and n+ buried layer 114. N-well regions 116 and 106 are then implanted into the epitaxial layer 142 using a second masking layer (not shown). P-well regions (not shown) are also implanted into the epitaxial layer 142 using a third masking layer. The n-well and p-well doping levels are chosen to maximize CMOS performance. N-well region 116 forms the base of LPNP 102 and n+ buried layer 114 forms a low resistance base.

Next, isolation regions 124 are formed. Isolation regions 124 may, for example, shallow trench isolation. Other isolation structures are known in the art. Methods of forming shallow trench isolation regions are known in the art. Isolation regions 124 isolate LPNP 102 and CMOS transistor 104 from each other and other devices (not shown).

Then, a high energy, high dose n-type implant (e.g., phosphorous) and diffusion is then used to form base contact 126. This implant is the "deep N" implant that is typically used to contact any NPN collectors (not shown). An isolation region 124 also separates the collector 120 and base contact 126.

Referring to FIG. 5C, gate electrodes 122 and 110 are formed next. Typically, a gate dielectric 150, such as silicon dioxide, is formed on the surface of the semiconductor body 152. (Actually, it is the surface of the epitaxial layer 142. Hereinafter, the term semiconductor body will refer to the combined structure of the substrate 101 and epitaxial layer 142). Then, a layer of polysilicon is deposited, patterned and etched to form the gate electrodes 122 and 110. Then, p-type drain extension regions 109 are formed in the surface of the semiconductor body 152. The dopant concentration of drain extension regions 109 is optimized for CMOS performance.

Next, sidewall spacers 111 are formed on the sidewalls of the gate electrodes 122 and 110 as shown in FIG. 4. Sidewall spacers 111 typically comprise silicon nitride, silicon oxide, or a combination thereof. They are formed by deposition of the desired layers and anisotropic etchback. Then, p-type source/drain regions 108 are implanted and annealed. The collector region 120 and emitter region 118 are formed simultaneously with the p-type source/drain regions 108. Boron is typically used with the implant dose and energy being optimized for CMOS performance. Processing may then continue to form contacts and interconnect layers as is known in the art.

While this invention has been described with reference to illustrative embodiments, this description is not intended to be construed in a limiting sense. Various modifications and combinations of the illustrative embodiments, as well as other embodiments of the invention, such as switching the conductivity types of the elements, will be apparent to persons skilled in the art upon reference to the description. It is therefore intended that the appended claims encompass any such modifications or embodiments.

In the claims:

1. An integrated circuit having a lateral bipolar transistor comprising:

a base well region located in a semiconductor body;

a collector region located at a first portion of a surface of said base well region;

an emitter region located at a second portion of said surface of said n-well base region;

a gate electrode located over a third portion of said surface of said base well region, said third portion located between said first and second portions; and a buried layer forming a low resistance base region, said buried layer located below said base well region under said collector but not below a center of said emitter region.

2. The integrated circuit of claim 1, wherein said buried layer extends below said gate electrode.

3. The integrated circuit of claim 1, wherein said buried layer extends below an edge of said emitter region.

4. The integrated circuit of claim 1, wherein said buried layer is doped n+.

5. The integrated circuit of claim 1 further comprising a plurality of CMOS transistors located in said semiconductor body but isolated from said lateral bipolar transistor.

6. The integrated circuit of claim 1, wherein said lateral bipolar transistor is a lateral PNP transistor.

7. The integrated circuit of claim 1, further comprising a base contact isolated from said collector region for contacting said base well region through said buried layer.

* * * * *